United States Patent
Veenstra et al.

(10) Patent No.: US 6,472,903 B1
(45) Date of Patent: Oct. 29, 2002

(54) PROGRAMMABLE LOGIC DEVICE INPUT/OUTPUT ARCHITECTURE WITH POWER BUS SEGMENTATION FOR MULTIPLE I/O STANDARDS

(75) Inventors: Kerry Veenstra, San Jose, CA (US); Krishna Rangasayee, Sunnyvale, CA (US); John E. Turner, Santa Cruz, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/366,938

(22) Filed: Aug. 4, 1999

Related U.S. Application Data
(60) Provisional application No. 60/115,216, filed on Jan. 8, 1999.

(51) Int. Cl.[7] ................... H03K 19/173; H03K 19/177
(52) U.S. Cl. ................ 326/38; 326/40; 326/39; 326/41
(58) Field of Search ................ 326/37, 38, 39, 326/40, 41

(56) References Cited

U.S. PATENT DOCUMENTS

| | | | |
|---|---|---|---|
| 4,494,021 A | 1/1985 | Bell et al. ................ 307/591 |
| 4,527,079 A | 7/1985 | Thompson ................ 326/475 |
| 4,633,488 A | 12/1986 | Shaw ................ 375/120 |
| 4,658,156 A | 4/1987 | Hashimoto ................ 307/350 |
| 4,719,593 A | 1/1988 | Threewitt et al. ............ 364/900 |
| 4,853,560 A | 8/1989 | Iwamura et al. ......... 307/296.1 |
| 4,868,522 A | 9/1989 | Popat et al. .................... 331/2 |
| 4,959,646 A | 9/1990 | Podkowa et al. ...... 340/825.83 |
| 5,059,835 A | 10/1991 | Lauffer et al. ............... 307/576 |
| 5,072,195 A | 12/1991 | Graham et al. ................ 331/2 |
| 5,075,575 A | 12/1991 | Shizukuishi et al. ......... 307/465 |
| 5,079,519 A | 1/1992 | Ashby et al. ................ 331/1 A |
| 5,133,064 A | 7/1992 | Hotta et al. ................ 395/550 |
| 5,144,167 A | 9/1992 | McClintock ................ 307/475 |
| 5,204,555 A | 4/1993 | Graham et al. ............. 307/465 |
| 5,349,544 A | 9/1994 | Wright et al. ............... 364/600 |

(List continued on next page.)

FOREIGN PATENT DOCUMENTS

| | | |
|---|---|---|
| EP | 0 266 065 | 9/1987 |
| EP | 0 575 124 | 12/1993 |
| JP | 1-137646 | 5/1989 |

OTHER PUBLICATIONS

DynaChip Corp., "Application Note: Using Phase Locked Loops in DL6035 Devices" (1998).

DynaChip Corp., DY6000 Family Datasheet (Dec. 1998).

LSI Logic Corp., 500K Technology Design Manual (Document DB04–000062–00, First Edition), pp. 8–1–8–33 (Dec. 1996).

(List continued on next page.)

*Primary Examiner*—Michael Tokar
*Assistant Examiner*—Vibol Tan
(74) *Attorney, Agent, or Firm*—Fish & Neave; Jeffrey H. Ingerman

(57) ABSTRACT

In a programmable logic device, input/output circuits are grouped into blocks. Each block includes input/output circuits capable of handling a plurality of logic signalling schemes, which may require different supply voltages and reference voltages. Each block also has its own power supply bus. In this way, the different blocks can be provided with different supply and reference voltages, so that different blocks can be used for different logic signalling schemes, thereby allowing more than one such scheme to be used simultaneously on a single device. A single block could also be implemented with more than one scheme active, as long as all of the schemes in use in the block have the same power supply requirements and—to the extent that each such scheme requires a reference voltage—the same reference voltage requirements.

26 Claims, 6 Drawing Sheets

U.S. PATENT DOCUMENTS

| | | | | |
|---|---|---|---|---|
| RE34,808 | E | 12/1994 | Hsieh | 326/71 |
| 5,397,943 | A | 3/1995 | West et al. | 326/39 |
| 5,418,499 | A | 5/1995 | Nakao | 331/57 |
| 5,420,544 | A | 5/1995 | Ishibashi | 331/11 |
| 5,506,878 | A | 4/1996 | Chiang | 377/39 |
| 5,521,530 | A | 5/1996 | Yao et al. | 326/80 |
| 5,557,219 | A | 9/1996 | Norwood et al. | 326/49 |
| 5,589,783 | A | 12/1996 | McClure | 326/71 |
| 5,646,564 | A | 7/1997 | Erickson et al. | 327/158 |
| 5,699,020 | A | 12/1997 | Jefferson | 331/17 |
| 5,742,178 | A | 4/1998 | Jenkins, IV et al. | 326/33 |
| 5,742,180 | A | 4/1998 | DeHon et al. | 326/40 |
| RE35,797 | E | 5/1998 | Graham et al. | 326/40 |
| 5,777,360 | A | 7/1998 | Rostoker et al. | 257/315 |
| 5,796,269 | A | * 8/1998 | New | 326/40 |
| 5,801,548 | A | 9/1998 | Lee et al. | 326/44 |
| 5,815,016 | A | 9/1998 | Erickson | 327/158 |
| 5,847,617 | A | 12/1998 | Reddy et al. | 331/57 |
| 5,877,632 | A | 3/1999 | Goetting et al. | 326/50 |
| 5,936,423 | A | 8/1999 | Sakuma et al. | 326/16 |
| 5,952,726 | A | 9/1999 | Liang | 257/778 |
| 5,958,026 | A | 9/1999 | Goetting et al. | 710/52 |
| 5,970,255 | A | 10/1999 | Tran et al. | 395/893 |
| 5,982,195 | A | 11/1999 | Cliff et al. | 326/41 |
| 5,986,469 | A | * 11/1999 | Eaton et al. | 326/41 |
| 5,991,224 | A | * 11/1999 | Aipperspach et al. | 365/230.05 |
| 6,020,759 | A | * 2/2000 | Heile | 326/40 |
| 6,034,536 | A | * 3/2000 | McClintock et al. | 326/10 |
| 6,104,207 | A | * 8/2000 | Chan et al. | 326/40 |
| 6,175,952 | B1 | 1/2001 | Patel et al. | 716/18 |

OTHER PUBLICATIONS

Lucent Technologies, Inc., Optimized Reconfigurable Cell Array (ORCA®) OR3Cxxx/OR3Txxx Series Field–Programmable Gate Arrays, Preliminary Product Brief, (Nov. 1997).

Lucent Technologies, Inc., ORCA® Series 3 Field–Programmable Gate Arrays, Preliminary Data Sheet, Rev. 01 (Aug. 1998).

National Semiconductor Corp., *LVDS Owner's Manual & Design Guide* (Apr. 25, 1997).

National Semiconductor Corp., "DS90CR285/DS90CR286 +3.3V Rising Edge Data Strobe LVDS 28–Bit Channel Link–66 MHZ," (Mar. 1998).

Xilinx, Inc., Virtex 2.5V Field Programmable Gate Arrays Advance Product Specification (Version 1.0) (Oct. 20, 1998).

Xilinx, Inc., Application Note: Using the Virtex Delay–Locked Loop (Version 1.31) (Oct. 21, 1998).

Advanced Micro Devices, Inc., "Am2971 Programmable Event Generator (PEG)," Publication No. 05280, Rev. C, Amendment /0, pp. 4–286–4–303 (Jul. 1986).

Advanced Micro Devices, Inc., "AmPAL *22S8 20–Pin IMOX PAL–Based Sequencer," Publication No. 06207, Rev. B, Amendment/0, pp. 4–102–4–121 (Oct. 1986).

Ko, U., et al., "A 30–ps Jitter, 3.6 $\mu$s Locking, 3.3–Volt Digital PLL for CMOS Gate Arrays," *Proceedings of the IEEE 1993 Custom Integrated Circuits Conference*, Publication No. 0–7803–0826–3/93, pp. 23.3.1–23.3.4 (May 9–12, 1993).

Monolithic Memories, Inc., "Programmable Array Logic PAL20RA10–20 Advance Information," pp. 5–95–5–102 (Jan. 1988).

Zaks, R., et al., *From Chips to Systems: An Introduction to Microcomputers*, pp. 54–61 (Prentice–Hall, Inc., Englewood Cliffs, N.J., 1987).

"A 3.3–V Programmable Logic Device that Addresses Low Power Supply and Interface Trends," *IEEE 1997 Custom Integrated Circuits Conference*, May 1997, pp. 539–542.

* cited by examiner

PROGRAMMABLE LOGIC DEVICE INPUT/OUTPUT ARCHITECTURE WITH POWER BUS SEGMENTATION FOR MULTIPLE I/O STANDARDS

CROSS REFERENCE TO RELATED APPLICATION

This claims the benefit of U.S. Provisional Patent Application No. 60/115,216, filed Jan. 8, 1999.

BACKGROUND OF THE INVENTION

This invention relates to an input/output architecture for a programmable logic device, and more particularly to a programmable logic device having a plurality of input/output regions, each capable of supporting input/output standards with different power requirements than the other regions.

Programmable logic devices are well known. Commonly, a programmable logic device has a plurality of substantially identical logic elements, each of which can be programmed to perform certain desired logic functions. The logic elements have access to a programmable interconnect structure that allows a user to interconnect the various logic elements in almost any desired configuration. Finally, the interconnect structure also provides access to a plurality of input/output ("I/O") pins, with the connections of the pins to the interconnect structure also being programmable and being made through suitable I/O buffer circuitry.

At one time, programmable logic devices of the type just described were implemented almost exclusively using transistor-transistor logic ("TTL"), in which a logical "high" signal was nominally at 5 volts, while a logical "low" signal was nominally at ground potential, or 0 volts. More recently, however, other logic standards have come into general use, some of which use different signalling schemes, such as LVTTL (Low Voltage TTL, which exists in a 3.3-volt version or a 2.5-volt version), PCI (Peripheral Component Interface, which requires a 3.3-volt power supply), SSTL (Series Stub Terminated Logic, which has several variants), GTL (Gunning Transceiver Logic) or GTL+, HSTL (High Speed Transceiver Logic, which has several variants), LVDS (Low Voltage Differential Signalling), and others. Not only might these signalling schemes use different voltage levels for a "high" signal, and therefore require different supply voltages (the power supply requirements for these various standards may be 5.0 volts, 3.3 volts, 2.7 volts, 2.5 volts, 1.8 volts or 1.5 volts), but some of them, such as GTL/GTL+, various variants of SSTL and HSTL, and other standards such as CTT, ECL and 3.3 V AGP, may require a source of reference voltage. Typically, like the supply voltage, reference voltage would be supplied externally, using one of the I/O pins.

Power for the circuitry on the programmable logic device is typically supplied by a power bus that extends over the entire device. Heretofore, that same power bus supplied power to all of the I/O circuitry as well. Similarly, if a reference voltage were needed, a reference voltage bus would be provided on the device to supply all of the circuitry that required the reference voltage.

There is no inherent reason why two or more different I/O standards could not be used on one programmable logic device, with some I/O pins driven by circuitry compatible with one standard and other I/O pins driven by circuitry compatible with a different standard. However, the known single supply voltage bus and single reference voltage bus (if multiple reference voltages are needed) would be unable to supply more than one such standard or, at best, would only be able to supply multiple standards all of which had the same power requirements.

It would be desirable to be able to provide a programmable logic device that programmably supports a plurality of I/O standards, at least two of those standards being supportable simultaneously.

It would further be desirable to be able to provide such a programmable logic device in which the plurality of I/O standards could have different power requirements which could be met simultaneously by the programmable logic device.

SUMMARY OF THE INVENTION

It is an object of this invention to attempt to provide a programmable logic device that programmably supports a plurality of I/O standards, at least two of those standards being supportable simultaneously.

It is a further object of this invention to attempt to provide such a programmable logic device in which the plurality of I/O standards could have different power requirements which could be met simultaneously by the programmable logic device.

In accordance with the present invention, there is provided an input/output structure for a programmable logic device that accommodates a plurality of logic signalling standards having differing power requirements. The input/output structure has a plurality of input/output terminals, and a plurality of input/output circuits associated with that plurality of input/output terminals. Each of the input/output circuits programmably accommodates at least some of the plurality of logic signalling standards and is coupled to a respective one of the input/output terminals for buffering input/output signals between that respective one of the input/output terminals and the programmable logic device. The input/output structure also has a plurality of power bus conductors, and each of the power bus conductors is spatially disposed adjacent a respective subset of the plurality of input/output circuits. When circuits in each respective subset of the plurality of input/output buffers are programmably configured for one of the plurality of logic signalling standards, a respective power bus conductor adjacent each respective subset provides power compatible with power requirements of that one of the standards for which circuits in the respective subset are configured.

In a programmable logic device, or other integrated circuit, which supports a variety of logic signalling standards, each of which may have different power requirements and some of which may require voltage references, an I/O structure can be provided that allows more than one of those logic signalling standards to be used at the same time on the programmable logic device or other integrated circuit. Specifically, in accordance with the invention, an I/O circuit can be provided at each I/O terminal or pin that is capable of handling all of the different kinds of logic signalling standards, with the standard used at a particular terminal chosen by suitably programming the associated I/O circuit. However, instead of providing a single power supply bus for all of the I/O circuits and a single reference supply bus for all of the I/O circuits (assuming that at least one of the logic signalling standards requires a reference voltage), the I/O circuits are broken down into groups, with each group served by its own power bus and its own reference bus. Each respective one of these buses has its own associated I/O pin at which the user supplies the correct supply or reference voltage for the logic signalling standard he has chosen to use at the group of I/O terminals served by those respective supply and reference buses. Preferably, all members of a particular group of I/O circuits served by a particular set of power and reference buses are spatially near one another. It is also possible for the I/O circuits in the group to be spread around the programmable logic device or other integrated circuit, although there is a penalty paid in die area or "real estate" because the buses must run all over the device instead of being limited to a compact area. Similarly, it is also within the scope of the invention to have independent power buses, and reference buses (if appropriate), for each standard running to all I/O circuits on the device, or at least to I/O circuits in all areas of the device, although there is also a "real estate" penalty in such an embodiment.

In a particularly preferred embodiment, not all I/O circuits can handle all of the various logic signalling standards used on the device. Specifically, because of the particularly different requirements of Low Voltage Differential Signalling (LVDS), the LVDS circuits are separate from the other types of I/O circuits. Indeed, the input and output requirements of LVDS are so different that preferably there are separate LVDS input circuits (which preferably actually can handle all types of inputs, and also all types of outputs except LVDS outputs), and separate LVDS output circuits (which preferably can handle all kinds of outputs and all types of inputs except LVDS inputs).

I/O pins on programmable logic devices and other integrated circuits are typically provided at the edge of the device. Therefore, in accordance with the present invention, the difference groups or blocks of I/O circuits served by the different power and reference buses are typically arranged as blocks of adjacent I/O circuits along the device edge. Each block preferably has a power bus and a reference bus running alongside it, substantially parallel to the device edge. Each bus preferably runs in the same place relative to its associated block that other buses occupy relative to their respective blocks. This conserves die area on the device, because a single bus or pair of buses can be provided, which is then segmented at the boundaries of the various blocks to create the independent buses.

Alternatively, the device may be constructed using bump array technology, which is well known, where the I/O terminals may be anywhere on the surface of the device and are contacted by suitable bumps on a contact plane parallel to the device surface. In such a device, the various I/O circuits still are preferably grouped together spatially, so that the bumps used to provide the power and reference voltages to circuits using identical standards can be ganged or banked together.

Moreover, while an individual I/O circuit can only be configured for one standard in any given configuration of the programmable logic device, it is not necessary for all I/O circuits in a particular block according to this invention to be configured the same way. It is only necessary that all I/O circuits in the block be configured to have the same power requirements, because only one power supply voltage can be provided to the block. Similarly, if some I/O circuits in a block need a reference voltage, it is only necessary that all I/O circuits in the block that need a reference voltage need the same reference voltage. It is even possible to have different I/O circuits in the block, all of which have the same power supply voltage requirements, but only some of which require a reference voltage at all. As long as those circuits that do not require a reference voltage use the same power supply voltage, they simply ignore the reference voltage bus. Moreover, it is also possible to have an output circuit that does not require a power supply voltage (GTL/GTL+ pull to ground for a logic "low" and simply do not drive the output for a logic "high"), but does require a reference voltage, and such a circuit can be included in a block with other circuits requiring the same reference voltage, regardless of the power supply voltage in that block, which the circuit will simply ignore.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, in which.

DETAILED DESCRIPTION OF THE INVENTION

Figure 1:
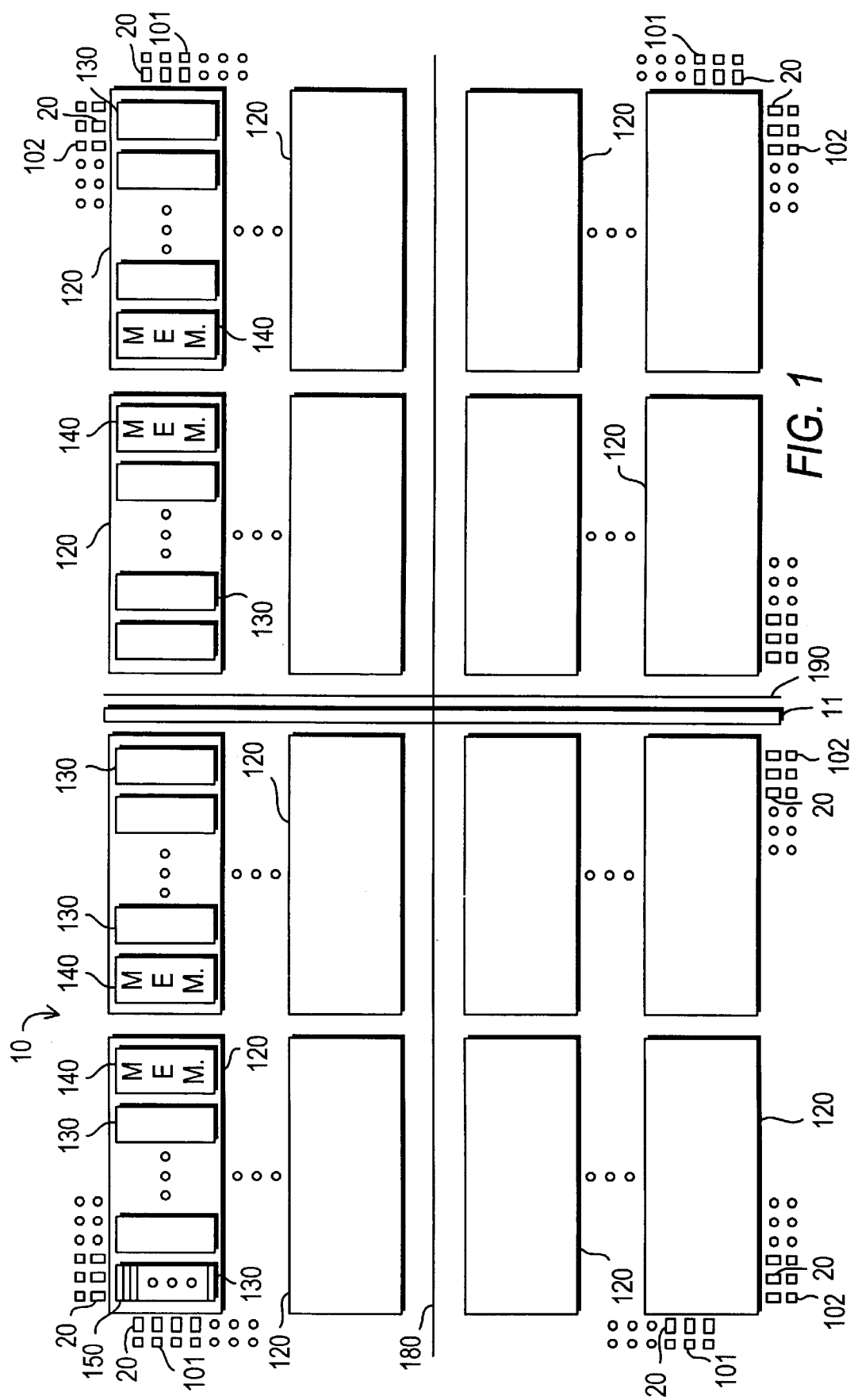
FIG. 1 is a schematic representation of a programmable logic device incorporating a power structure according to the present invention.

FIG. 1 shows, as an example of a device in which the present invention can be used, a programmable logic device 10 that can accommodate a plurality of different logic signalling schemes, and has a reference voltage bus therein. It should be recognized, however, that the present invention can be used with other types of programmable logic devices that use signalling schemes requiring different supply or reference voltages.

The illustrative programmable logic device 10 constructed in accordance with this invention, which is described in more detail in copending, commonly-assigned U.S. patent application Ser. No. 09/266,235, filed Mar. 10, 1999, which is hereby incorporated by reference in its entirety, includes 112 super-regions 120 of programmable logic and memory disposed on the device in a two-dimensional array of 28 rows and four columns of super-regions. Each row includes four super-regions and each column includes 28 super-regions. The fourteenth row from the top is a "spare" row that is used only when it is necessary to make up for a defect in one of the thirteen rows above that spare row. Similarly, the fourteenth row from the bottom is a spare row that is used only when it is necessary to make up for a defect in one of the thirteen rows below that spare row. A certain amount of "redundancy" is thus provided on device 10.

Each super-region 120 includes a row of 16 regions 130 of programmable logic and one region 140 of memory, which the user of device 10 can use as RAM, ROM, etc.

Each logic region 130 includes a column of ten subregions 150 of programmable logic. To avoid over-crowding FIG. 1, only the extreme upper left-hand logic region 130 has its subregions 150 shown separately.

FIG. 1 also shows that each row of super-regions 120 (except the spare rows) has "horizontal" I/O pins 101 adjacent each end of the row. The top-most and bottom-most rows have four I/O pins 101 adjacent each end, while all the other non-spare rows have five I/O pins 101 adjacent each end. "Vertical" I/O pins 102 are similarly provided at each end of each column of logic regions 130. In general, two I/O pins 102 are provided at each end of each such column, except that in each super-region column only one I/O pin 102 is provided at each end of the extreme left-most and right-most column of logic regions 130.

In FIG. 1, the horizontal line 180 and the vertical line 190 divide the circuitry into four equal-sized quadrants. Lines 180 and 190 represent segmentation buffers in certain interconnection conductors as shown and described in more detail in said above-incorporated application Ser. No. 09/266,235.

A reference voltage bus 11 extends throughout device 10. Although as shown in FIG. 1, reference voltage bus 11 is located at about the center of device 10, it can be provided in any suitable location on device 10, as will be discussed below in connection with this invention. A plurality of different types of conductors (not shown) interconnect the various super-regions and logic regions and subregions. A plurality of programmable input/output circuits 20, one such programmable I/O circuit 20 for each I/O pin 101, 102, connect the various conductors (not shown) to input/output pins 101, 102. Programmable input/output circuits will be described below in connection with pins 101, but relate substantially identically to pins 102.

Figure 3:
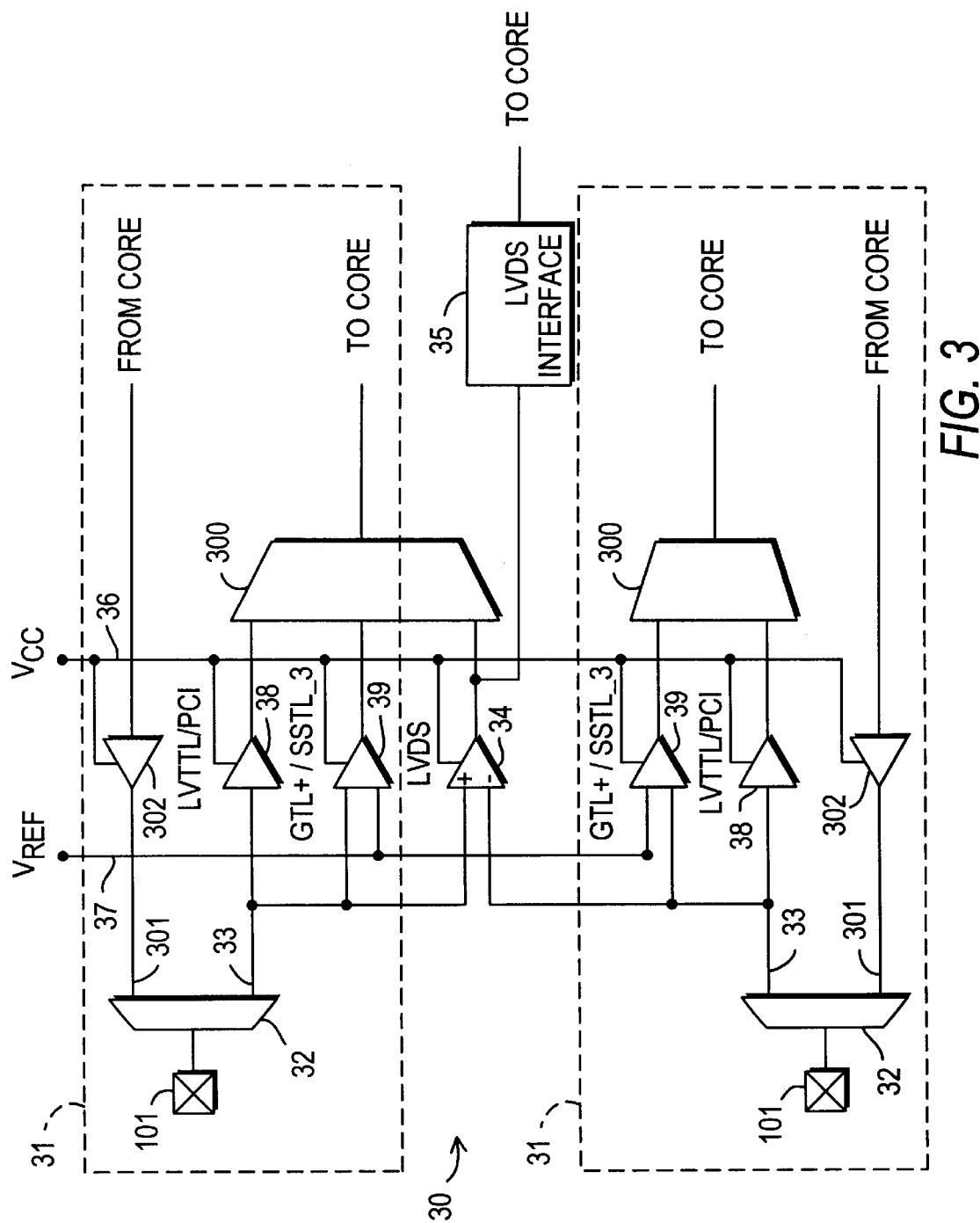
FIG. 3 is a schematic representation of a programmable I/O circuit for the programmable logic device of FIGS. 1 and 2 according to the present invention capable of handling input and output for a plurality of different I/O standards, as well as input, but not output, for the LVDS standard.

A preferred embodiment of a programmable I/O circuit 30 capable of handling LVDS input, as well as input and output for a plurality of other signalling schemes, is shown in FIG. 3. Programmable I/O circuit 30 is associated with two different I/O pins 101, both of which are used for a single LVDS input when circuit 30 is used in LVDS input mode. When programmable I/O circuit 30 is not being used in LVDS mode, each portion 31 of circuit 30 can be used independently as input or output for one of the other standards on its respective I/O pin 101. When programmable I/O circuit 30 is being used in LVDS mode, then both I/O pins 101 are used for a single input.

Thus, when programmable I/O circuit 30 is used as an LVDS input, each I/O pin 101 is connected by respective multiplexer 32 to respective input branch 33, whereby it serves as one of two inputs to differential amplifier 34, which in turn feeds an LVDS input interface 35, which then feeds the input signal to the logic "core" of programmable logic device 10. LVDS amplifier 34 is connected to supply bus 36, which is supplied by the user through an appropriate I/O pin (not shown) with a 1.8-volt supply voltage. LVDS amplifier 34 does not require a reference voltage and therefore is not connected to reference bus 37.

When programmable I/O circuit 30 is not being used as an LVDS input circuit, it can be used as two I/O circuits for any of the other supported signalling schemes, with each portion 31 being used as a separate I/O circuit. If portion 31 is being used as an input circuit, then its respective I/O pin 101 is connected by multiplexer 32 to input branch 33, whence it is fed to both buffer 38 which is connected to supply bus 36 and buffer 39 which is connected to supply bus 36 and to reference bus 37. Buffer 38 can thus be used for standards, such as LVTTL or PCI, that do not require reference voltages, while buffer 39 can be used for standards, such as GTL, GTL+ or SSTL_3, that do require reference voltages. Depending on which standard is being used, the appropriate buffer 38, 39 will be programmably enabled and the appropriate voltages will be supplied by the user on the appropriate supply I/O pins (not shown). The output of the appropriate buffer 38, 39 will be programmably selected by multiplexer 300 and supplied to the logic core of programmable logic device 10. At low speeds, the output of LVDS buffer 34 also can be supplied to the core through multiplexer 300 rather than interface 35.

The signalling schemes that require reference voltages on their inputs do not require reference voltages on their outputs. Accordingly, in output mode, multiplexer 32 would be used to programmably connect I/O pin 101 to output branch 301, where buffer 302, connected to supply bus 36, buffers an output from the logic core of programmable logic device 10.

Figure 4:
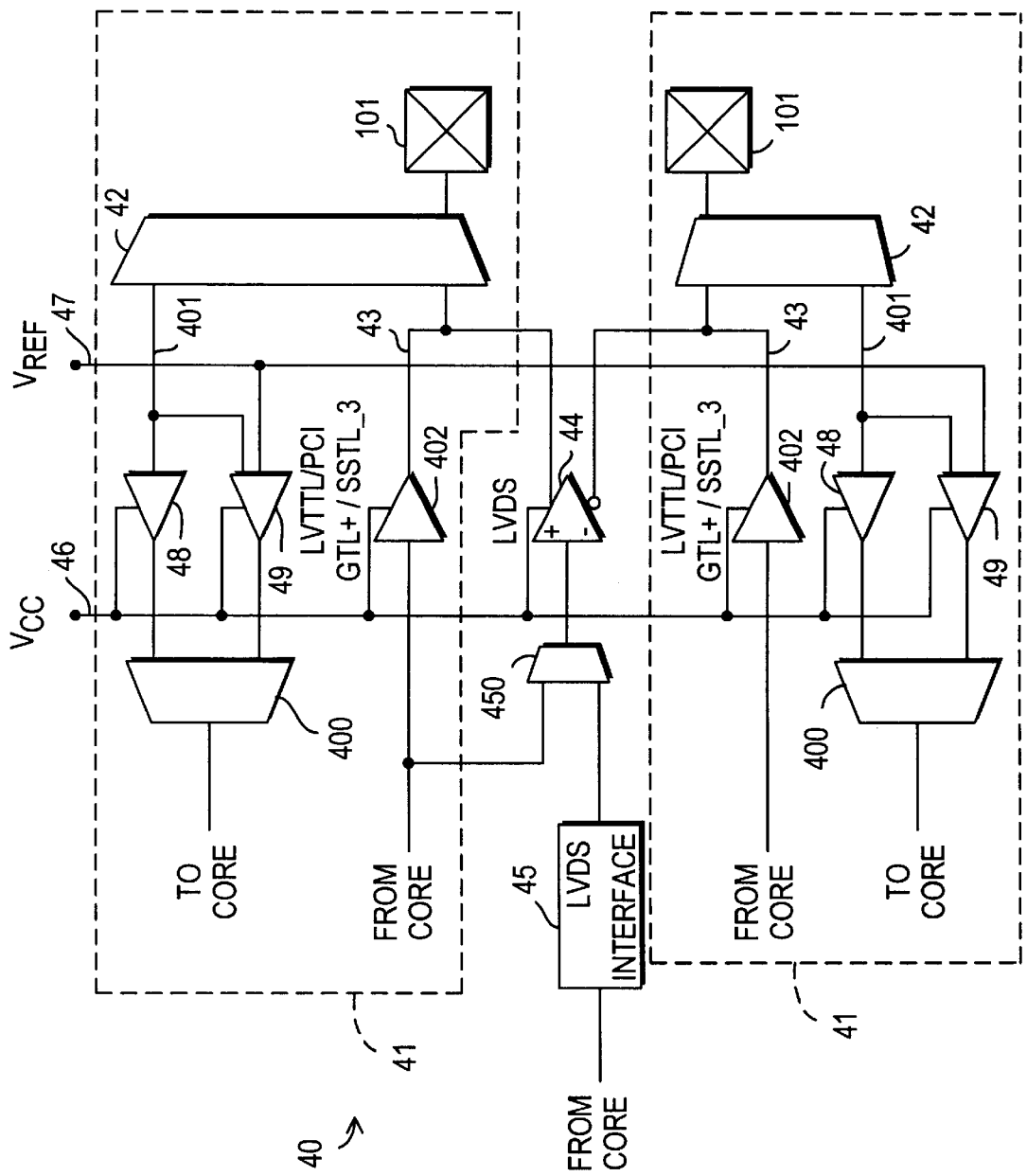
FIG. 4 is a schematic representation of a programmable I/O circuit for the programmable logic device of FIGS. 1–3 according to the present invention capable of handling input and output for a plurality of different I/O standards, as well as output, but not input, for the LVDS standard.

A preferred embodiment of a programmable I/O circuit 40 capable of handling LVDS output, as well as input and output for a plurality of other signalling schemes, is shown in FIG. 4. Programmable I/O circuit 40 is associated with two different I/O pins 101, both of which are used for a single LVDS output when circuit 40 is used in LVDS output mode. When programmable I/O circuit 40 is not being used in LVDS output mode, each portion 41 of circuit 40 can be used independently as input or output for one of the other standards on its respective I/O pin 101. When programmable I/O circuit 40 is being used in LVDS output mode, then both I/O pins 101 are used for a single output.

Thus, when programmable I/O circuit 40 is used as an LVDS output, each I/O pin 101 is connected by respective multiplexer 42 to respective output branch 43, whereby it serves as one of two outputs from differential amplifier 44, which in turn is fed through multiplexer 450 by an LVDS output interface 45, which is fed by the logic core of programmable logic device 10. LVDS amplifier 44 is connected to supply bus 46, which is supplied by the user through an appropriate I/O pin (not shown) with a 1.8-volt supply voltage. LVDS amplifier 44 does not require a reference voltage and therefore is not connected to reference bus 47. At low speeds, the input to LVDS buffer 44 also can be supplied from the core directly through multiplexer 450 rather than interface 45.

When programmable I/O circuit 40 is not being used as an LVDS output circuit, it can be used as two I/O circuits for any of the other supported signalling schemes, with each portion 41 being used as a separate I/O circuit. If portion 41 is being used as an input circuit, then its respective I/O pin 101 is connected by multiplexer 42 to input branch 401, whence it is fed both to buffer 48 which is connected to supply bus 46, and to buffer 49 which is connected to both supply bus 46 and reference bus 47. Buffer 48 can thus be used for standards, such as LVTTL or PCI, that do not require reference voltages, while buffer 49 can be used for standards, such as GTL, GTL+ or SSTL_3, that do require reference voltages. Depending on which standard is being used, the appropriate buffer 48, 49 will be programmably enabled and the appropriate voltages will be supplied by the user on the appropriate supply I/O pins (not shown). The output of the appropriate buffer 48, 49 will be programmably selected by multiplexer 400 and supplied to the logic core of programmable logic device 10.

The signalling schemes that require reference voltages on their inputs do not require reference voltages on their outputs. Accordingly, in output mode, multiplexer 42 would be used to programmably connect I/O pin 101 to output branch 43, where buffer 402, connected to supply bus 46, buffers an output from the logic core of programmable logic device 10.

It should be noted that although in the preferred embodiments shown, the input/output circuits are designed for either LVDS input or LVDS output, in addition to input and output for other signalling schemes, if an input/output circuit capable of handling both LVDS input and LVDS output could be provided, the use of such a circuit is contemplated to be within the present invention.

Figure 2:
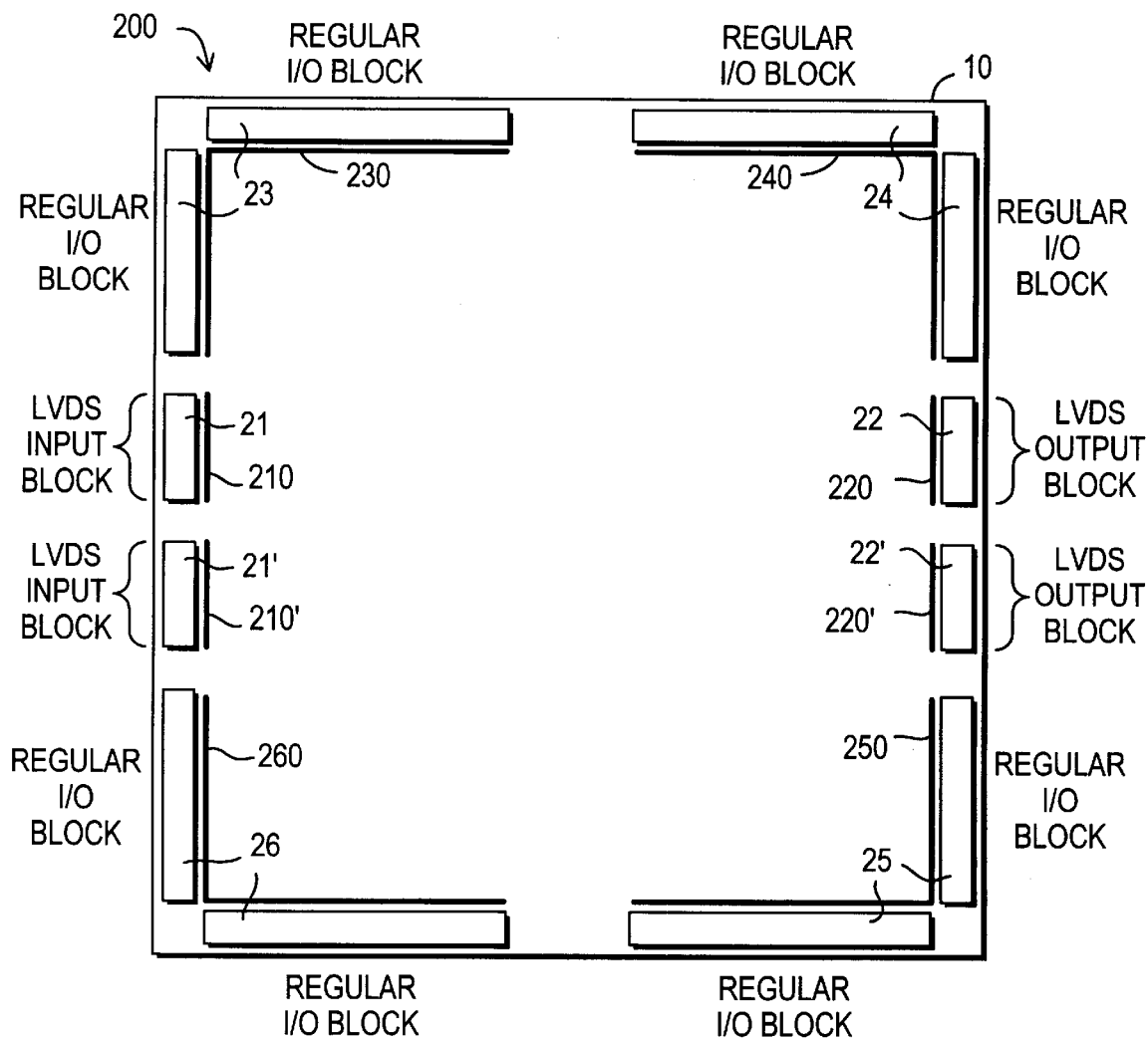
FIG. 2 is a schematic representation of an first preferred embodiment of the programmable logic device of FIG. 1 showing the power segmentation in schematic form.

One way to provide a programmable logic device 10 according to the present invention is to provide a plurality of programmable I/O circuits 30 and a plurality of I/O circuits 40, distributed throughout the locations labelled generically as "20" in FIG. 1. In that way, each input/output circuit could handle any of the several signalling schemes. However, the complications caused by the LVDS scheme, particularly the need for separate input and output circuits and an additional interface, make it more efficient to make only some of the I/O circuits on programmable logic device 10 LVDS-capable. Therefore, a more particularly preferred arrangement 200 is that shown in FIG. 2 where there are one or two particular blocks 21, 21' (two as shown in FIG. 2) which include I/O circuits 30 that can handle LVDS inputs and input and output for all of the other supported signalling schemes, and one or two particular blocks 22, 22' (two as shown in FIG. 2) in which include I/O circuits 40 that can handle LVDS outputs and input and output for all of the other supported signalling schemes. In this preferred embodiment, the remaining blocks 23, 24, 25, 26 preferably have I/O circuits (not shown) similar to portions 31, 41 of programmable I/O circuits 30, 40, capable of handling both input and output for all of the supported signalling schemes other than LVDS.

As can be seen, each I/O block 21, 21', 22, 23, 24, 25, 26 preferably has its own associated power bus 210, 210', 220, 230, 240, 250, 260, each of which preferably includes (not shown in FIG. 2) a supply bus 36, 46 and a reference bus 37, 47. These various power buses preferably are arranged on programmable logic device 10 so that each occupies the same space that a single power bus serving all I/O blocks 21, 21', 22, 22', 23, 24, 25, 26 would occupy, thus conserving die area.

As stated above, each programmable I/O circuit in each of I/O blocks 21, 21', 22, 22', 23, 24, 25, 26 preferably could be programmably configured to handle any of the supported logic signalling schemes. While it may be simpler or otherwise preferable for all I/O circuits in a particular I/O block to be configured for the same logic signalling standard, it is necessary only that all logic circuits in a particular I/O block be configured to a standard or standards that use the same supply voltage, and that if any standard to which any of the circuits is configured uses a reference voltage, then all of the circuits in that block configured to a standard that uses a reference voltage are configured to the same standard or to standards that use the same reference voltage. Circuits can also be configured to standards that use no reference voltage, as long as all circuits in the block are configured to standards that use the same supply voltage.

While FIG. 2 shows a preferred arrangement of I/O blocks and power buses on programmable logic device 10 according to this invention, other arrangements are possible. For example, blocks 21 and 21' could be combined into a single I/O block, as could blocks 22 and 22', and their respective power buses would be connected in such an embodiment into respective single buses. Alternatively, some of the blocks shown in FIG. 2 could be broken into smaller blocks, with their power buses broken into smaller buses accordingly. For example, each block 23–26 is on a corner of programmable logic device 10 and has two portions at right angles to one another on respective sides of device 10. In one alternative embodiment (not shown), any one or more of those blocks could be broken down so that each of the two orthogonal portions is a separate block. In such a case, the respective power bus preferably also would be broken into two buses.

Figure 5:
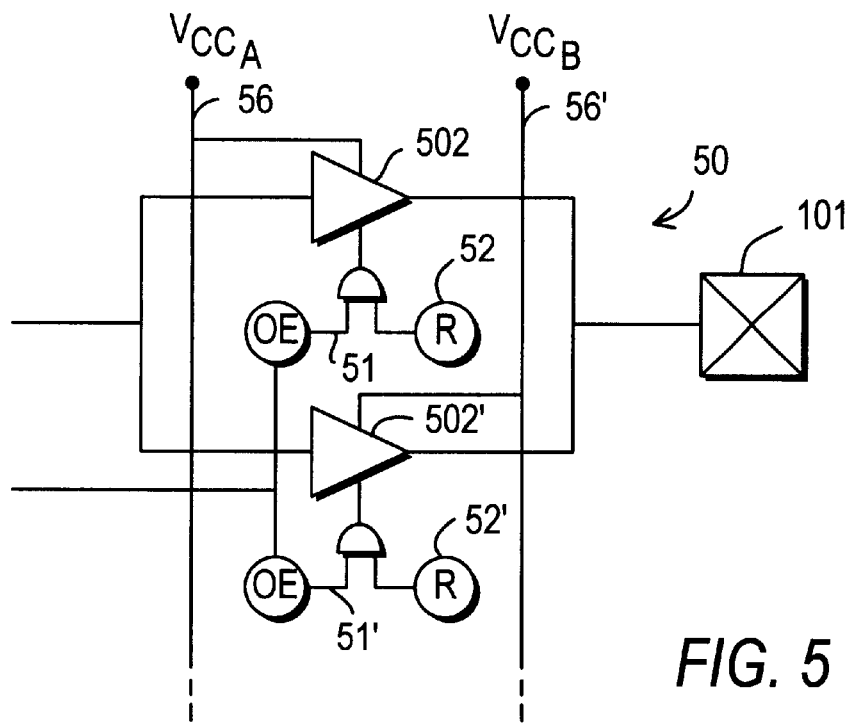
FIG. 5 is a schematic representation of the output portion of a programmable I/O circuit for a second preferred embodiment of a programmable logic device according to the present invention capable of handling input and output for a plurality of different I/O standards, as well as input, but not output, for the LVDS standard.

Because none of the logic signalling schemes referred to above requires reference voltage supplies at the output stage, the output stages of the I/O circuits shown above are simpler than the input stages, because the same buffers can be used for output for all of the schemes other than LVDS, as long as the appropriate supply voltage is provided. Therefore, the output stages are amenable to an alternative embodiment shown in FIG. 5, wherein each output stage 50, for outputs other than LVDS outputs, includes a plurality of output buffers 502, 502'. Each output buffer 502, 502' is activated by a respective output enable signal 51, 51' and a respective RAM bit 52, 52'. Buffer 502 is selected by asserting output enable signal 51 and programming RAM bit 52, while buffer 502' is selected by asserting output enable signal 51' and programming RAM bit 52'. Output enable signals 51, 51' could be ganged together as shown in FIG. 5, so that both are asserted in output mode, with buffer selection being under the control of RAM bits 52, 52', but signals 51, 51' also could be asserted separately.

Output buffer 502 is connected to a first power supply bus 56 at a first voltage, $V_{ccA}$, while output buffer 502' is connected to a second power supply bus 56' at a second voltage, $V_{ccB}$. Power supply buses 56, 56' preferably run to all portions of programmable logic device 10 in this embodiment. While slightly less efficient in terms of die area used, this embodiment also allows multiple standards to be used on a single device, and is not terribly inefficient as long as it is not used where a large number of different supply voltages is required.

Figure 6:
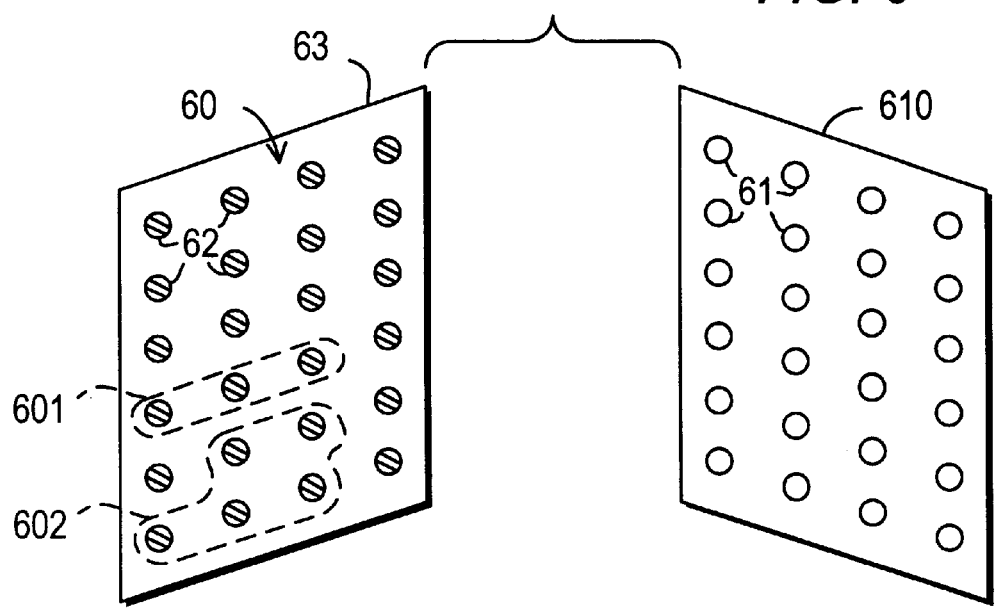
FIG. 6 is a simplified block diagram of power segmentation in a bump array embodiment of the present invention.

In another preferred embodiment shown in FIG. 6, programmable logic device 610 could have its input/output regions 61 scattered across the surface of the device 610. Connections to regions 61 would be made by a plurality of contact "bumps" 62 which are provided in an array 60 on a separate sheet 63 that is placed into contact with programmable logic device 610. In this known "bump array" technology, the power bus segmentation described above in connection with the different embodiments of programmable logic device 10 would be achieved in programmable logic device 610 by ganging together various groups 601, 602, etc., of bumps 62.

Figure 7:
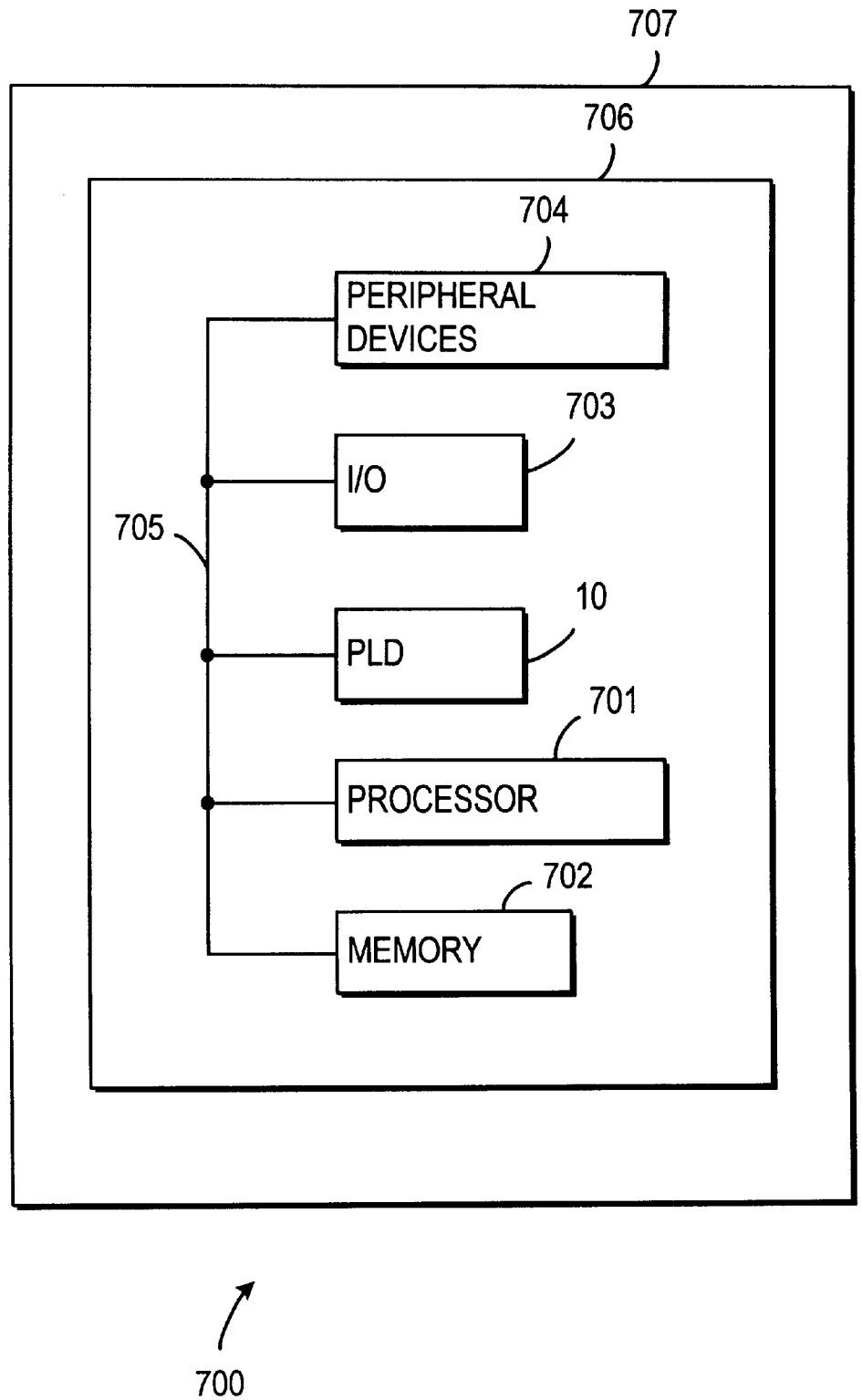
FIG. 7 is a schematic representation of a data processing system including a programmable logic device incorporating programmable I/O circuits according to this invention.

FIG. 7 illustrates a data processing system 700 incorporating a programmable logic device 10 according to this invention, although it could also incorporate programmable logic device 610. Data processing system 700 may include one or more of the following components: a processor 701; memory 702; I/O circuitry 703; and peripheral devices 704. These components are coupled together by a system bus 705 and are populated on a circuit board 706 which is contained in an end-user system 707.

System 700 can be used in a wide variety of applications, such as computer networking, data networking, instrumentation, video processing, digital signal processing, or any other application where the advantage of using programmable or reprogrammable logic is desirable. Programmable logic device 10 can be used to perform a variety of different logic functions. For example, programmable logic device 10 can be configured as a processor or controller that works in cooperation with processor 701. Programmable logic device 10 may also be used as an arbiter for arbitrating access to a shared resource in system 700. In yet another example, programmable logic device 10 can be configured as an interface between processor 701 and one of the other components in system 700. It should be noted that system 700 is only exemplary, and that the true scope and spirit of the invention should be indicated by the following claims.

Various technologies can be used to implement programmable logic devices 10, 610 according to this invention, as well as the various components of the programmable I/O circuits. Moreover, this invention is applicable to both one-time-only programmable and reprogrammable devices.

Thus it is seen that a programmable logic device that programmably supports a plurality of I/O standards, at least two of those standards being supportable simultaneously, and in which the plurality of I/O standards could have different power requirements which could be met simultaneously by the programmable logic device, has been provided. One skilled in the art will appreciate that the present invention can be practiced by other than the described embodiments, which are presented for purposes of illustration and not of limitation, and the present invention is limited only by the claims which follow.

What is claimed is:

1. An input/output structure for a programmable logic device that accommodates a plurality of logic signalling standards having differing power requirements, said input/output structure comprising:
   a plurality of input/output terminals;
   a plurality of input/output circuits associated with said plurality of input/output terminals, each of said input/output circuits programmably accommodating at least some of said plurality of logic signalling standards and being coupled to a respective one of said input/output terminals for buffering input/output signals between said respective one of said input/output terminals and said programmable logic device; and
   a plurality of power bus conductors; wherein:
      when a respective one of said plurality of input/output circuits is operated in accordance with one of said plurality of logic signalling standards, a respective power bus conductor provides power compatible with power requirements of said one of said standards in accordance with which said respective circuit is operated.

2. The input/output structure of claim 1 wherein each of said power bus conductors is spatially disposed adjacent a respective subset of said plurality of input/output circuits; wherein:
   when circuits in each respective subset of said plurality of input/output circuits are operated in accordance with one of said plurality of logic signalling standards, a respective power bus conductor adjacent each respective subset provides power compatible with power requirements of said one of said standards in accordance with which circuits in said respective subset are operated.

3. The input/output structure of claim 2 wherein at least two of said power conductors are disposed adjacent each said respective subset, whereby when circuits in said respective subset are operated in accordance with a logic signalling standard requiring a reference voltage, one of said at least two power conductors provides supply voltage and one of said at least two power conductors provides said reference voltage.

4. The input/output structure of claim 2 wherein:
   said plurality of input/output circuits are arranged substantially adjacent one or more edges of said programmable logic device; and
   said power conductors are arranged parallel to said one or more edges.

5. The input/output structure of claim 2 wherein:
   said plurality of input/output circuits are arranged in an array using bump array technology; and
   said power conductors are arranged in banks relative to said array.

6. A programmable logic device that programmably accommodates a plurality of logic signalling standards having differing power requirements, said programmable logic device comprising:
   programmable logic elements;
   an interconnect structure connecting said programmable logic elements;
   a plurality of input/output terminals;
   a plurality of input/output circuits connected to said interconnect structure and to said input/output terminals, each of said input/output circuits programmably accommodating at least some of said plurality of logic signalling standards and being coupled to a respective one of said input/output terminals for buffering input/output signals between said respective one of said input/output terminals and said programmable logic elements; and
   a plurality of power bus conductors; wherein:
      when a respective one of said plurality of input/output circuits is operated in accordance with one of said plurality of logic signalling standards, a respective power bus conductor provides power compatible with power requirements of said one of said standards in accordance with which said respective circuit is operated.

7. The programmable logic device of claim 6 wherein:
   each of said power bus conductors is spatially disposed adjacent a respective subset of said plurality of input/output circuits; and
   when circuits in each respective subset of said plurality of input/output circuits are operated in accordance with one of said plurality of logic signalling standards, a respective power bus conductor adjacent each respective subset provides power compatible with power requirements of said one of said standards in accordance with which circuits in said respective subset are operated.

8. The programmable logic device of claim 7 wherein at least two of said power conductors are disposed adjacent each said respective subset, whereby when circuits in said respective subset are operated in accordance with a logic signalling standard requiring a reference voltage, one of said at least two power conductors provides supply voltage and one of said at least two power conductors provides said reference voltage.

9. The programmable logic device of claim 7 wherein:
said plurality of input/output circuits are arranged substantially adjacent one or more edges of said programmable logic device; and
said power conductors are arranged parallel to said one or more edges.

10. The programmable logic device of claim 7 wherein:
said plurality of input/output circuits are arranged in an array using bump array technology; and
said power conductors are arranged in banks relative to said array.

11. A method for operating a programmable logic device that programmably accommodates a plurality of logic signalling standards having differing power requirements, said programmable logic device comprising:
programmable logic elements,
an interconnect structure connecting said programmable logic elements,
a plurality of input/output terminals,
a plurality of input/output circuits connected to said interconnect structure and to said input/output terminals, each of said input/output circuits programmably accommodating at least some of said plurality of logic signalling standards and being coupled to a respective one of said input/output terminals for buffering input/output signals between said respective one of said input/output terminals and said programmable logic elements, and
a plurality of power bus conductors; said method comprising:
when one of said plurality of input/output circuits is operated in accordance with one of said plurality of logic signalling standards, providing, through a respective power bus conductor, power compatible with power requirements of said one of said standards in accordance with which circuits in said respective subset are operated.

12. The method of claim 11 wherein, when each of said power bus conductors is spatially disposed adjacent a respective subset of said plurality of input/output output circuits, and circuits in each respective subset of said plurality of input/output circuits are operated in accordance with one of said plurality of logic signalling standards, said method further comprises providing, through a respective power bus conductor, power compatible with power requirements of said one of said standards in accordance with which circuits in said respective subset are operated.

13. The method of claim 12 wherein at least two of said power conductors are disposed adjacent each said respective subset, said method further comprising, when circuits in said respective subset are operated in accordance with a logic signalling standard requiring a reference voltage, providing supply voltage through one of said at least two power conductors, and providing said reference voltage through another one of said at least two power conductors.

14. A digital processing system comprising:
processing circuitry;
a system memory coupled to said processing circuitry; and
a programmable logic device as defined in claim 6 coupled to the processing circuitry and the system memory.

15. A printed circuit board on which is mounted a programmable logic device as defined in claim 6.

16. The printed circuit board defined in claim 15 further comprising:
a board memory mounted on the printed circuit board and coupled to the programmable logic device.

17. The printed circuit board defined in claim 16 further comprising:
processing circuitry mounted on the printed circuit board and coupled to the board memory.

18. An integrated circuit comprising:
an integrated circuit programmable logic device that programmably accommodates a plurality of logic signalling standards having differing power requirements, said integrated circuit programmable logic device comprising:
programmable logic elements;
an interconnect structure connecting said programmable logic elements;
a plurality of input/output terminals;
a plurality of input/output circuits connected to said interconnect structure and to said input/output terminals, each of said input/output circuits programmably accommodating at least some of said plurality of logic signalling standards and being coupled to a respective one of said input/output terminals for buffering input/output signals between said respective one of said input/output terminals and said programmable logic elements; and
a plurality of power bus conductors, each of said power bus conductors being spatially disposed adjacent a respective subset of said plurality of input/output circuits; wherein:
when circuits in each respective subset of said plurality of input/output circuits are operated in accordance with one of said plurality of logic signalling standards, a respective power bus conductor adjacent each respective subset provides power compatible with power requirements of said one of said standards in accordance with which circuits in said respective subset are operated.

19. The integrated circuit of claim 18 wherein:
each of said power bus conductors is spatially disposed adjacent a respective subset of said plurality of input/output circuits; and
when circuits in each respective subset of said plurality of input/output circuits are operated in accordance with one of said plurality of logic signalling standards, a respective power bus conductor adjacent each respective subset provides power compatible with power requirements of said one of said standards in accordance with which circuits in said respective subset are operated.

20. The integrated circuit of claim 19 wherein at least two of said power conductors are disposed adjacent each said respective subset, whereby when circuits in said respective subset are operated in accordance with a logic signalling standard requiring a reference voltage, one of said at least two power conductors provides supply voltage and one of said at least two power conductors provides said reference voltage.

21. The integrated circuit of claim 19 wherein:
said plurality of input/output circuits are arranged substantially adjacent one or more edges of said programmable logic device; and
said power conductors are arranged parallel to said one or more edges.

22. The integrated circuit of claim 19 wherein:
said plurality of input/output circuits are arranged in an array using bump array technology; and said power conductors are arranged in banks relative to said array.

23. A digital processing system comprising:

processing circuitry;

a system memory coupled to said processing circuitry; and an integrated circuit as defined in claim 18 coupled to the processing circuitry and the system memory.

24. A printed circuit board on which is mounted an integrated circuit as defined in claim 18.

25. The printed circuit board defined in claim 24 further comprising:

a board memory mounted on the printed circuit board and coupled to the integrated circuit.

26. The printed circuit board defined in claim 25 further comprising:

processing circuitry mounted on the printed circuit board and coupled to the board memory.

* * * * *